United States Patent [19]

Memishian, Jr.

[11] 4,034,366
[45] July 5, 1977

[54] ANALOG-TO-DIGITAL CONVERTER WITH CONTROLLED LADDER NETWORK

[75] Inventor: John Memishian, Jr., Arlington, Mass.

[73] Assignee: Analog Devices, Inc., Norwood, Mass.

[22] Filed: Jan. 28, 1976

[21] Appl. No.: 653,235

[52] U.S. Cl. .................. 340/347 AD; 340/347 DA; 340/347 M
[51] Int. Cl.² ..................................... H03K 13/02
[58] Field of Search ............ 340/347 AD, 347 DA, 340/347 M; 307/229; 330/9, 69, 30 D, 38 N

[56] References Cited

UNITED STATES PATENTS 3,505,668   4/1970   Ottesen .................. 340/347 AD

OTHER PUBLICATIONS

Analog Devices, Inc., Analog-Digital Conversion Handbook, June, 1972, pp. II-34 to II-41 & II-80 to II-83.

*Primary Examiner*—Thomas J. Sloyan
*Attorney, Agent, or Firm*—Parmelee, Johnson & Bollinger

[57] ABSTRACT

An analog-to-digital converter of the successive-approximation type including a digital-to-analog converter (DAC) comprising a plurality of independently-switchable current sources producing identical currents and connected to respective junction points of an R-2R ladder network. The common ladder terminal is driven by an operational amplifier so that the potential of the common terminal tracks that of the ladder output terminal. The ladder common terminal is connected to a comparator together with a sense ground lead. The output of the comparator is directed to bit sequencer circuitry which controls the switching of the DAC current sources to effect a match between the analog input current and the ladder output current.

16 Claims, 3 Drawing Figures

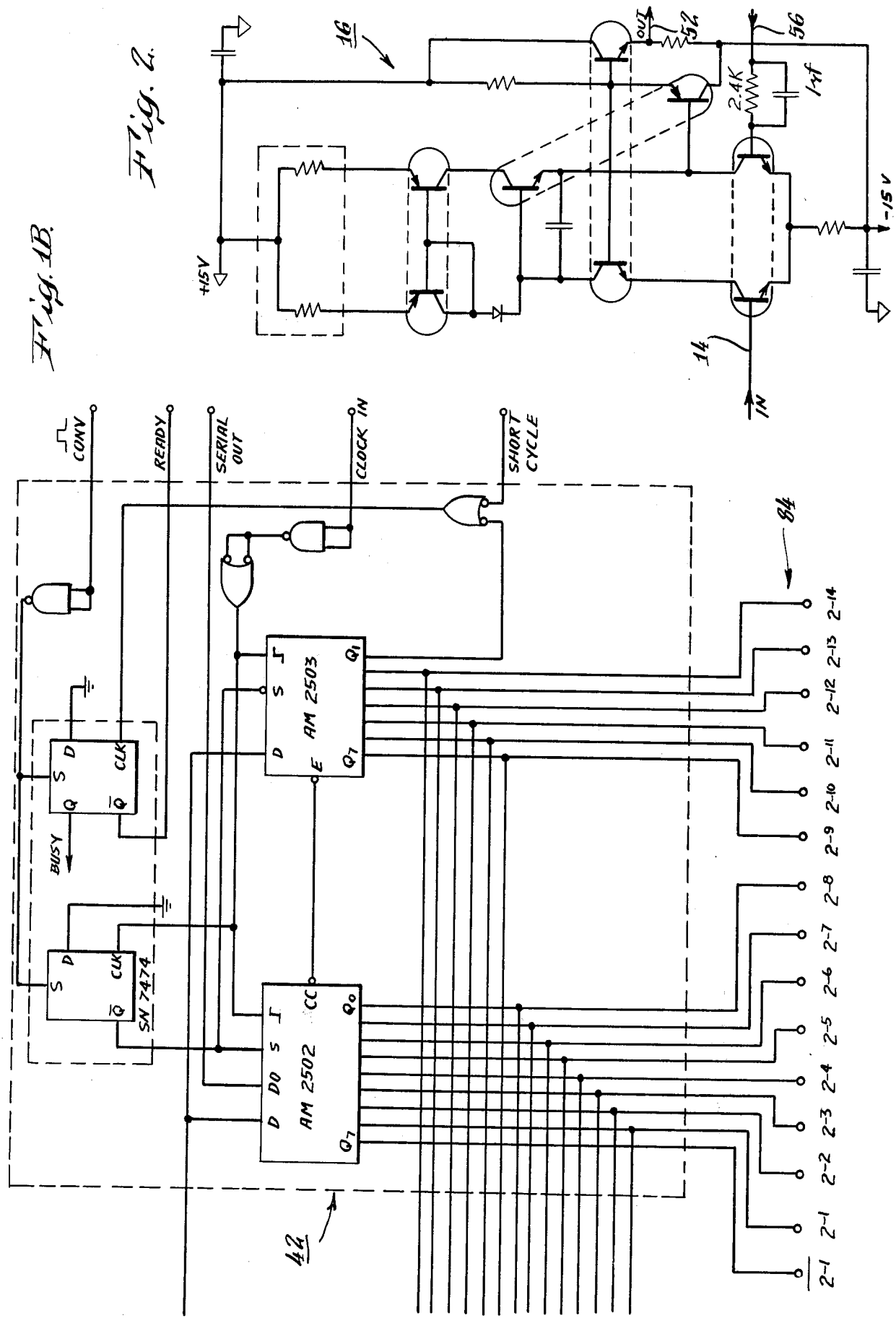

ANALOG-TO-DIGITAL CONVERTER WITH CONTROLLED LADDER NETWORK

BACKGROUND OF THE INVENTION

1. Field of the Invention

This invention relates to digital-to-analog converters of the type including a plurality of current sources connected to a current-dividing network arranged to set the current contribution from each current source. In an embodiment of this invention described hereinbelow, such a digital-to-analog converter is incorporated as part of a successive-approximation analog-to-digital converter providing improved performance capability.

2. Description Of The Prior Art

Digital-to-analog converters have been used for years in numerous applications. Such converters are, for example, used in successive-approximation analog-to-digital converters which are frequently employed for interfacing with digital computers because they have both high resolution and high-speed capabilities. In successive-approximation converters the unknown analog input is compared with the output of the digital-to-analog converter (often called a DAC), and the results of the comparison are used to control the switches of the DAC until its output matches the unknown analog input.

In carrying out such conversion, the switches of the DAC are controlled by conventional step-by-step sequencer devices, and at each step the comparison between the DAC output and the analog input controls the binary state of corresponding register stages in which the digital output signal is developed. (The nature of this operation is now well known, as described for example at page II-81 of the "A D Conversion Handbook" published by Analog Devices, Inc., of Norwood, Mass.). When the final match has been achieved between the analog input and the DAC output, the digital signal stored in the registers of the DAC represents in digital format the magnitude of the unknown analog input signal, and serves as the digital output signal of the analog-to-digital converter.

Digital-to-analog converters for successive-approximation analog-to-digital converters often have been of the type using a series of independently switchable current sources, especially sources producing currents of identical magnitude. In such case, the binary weighting of the switchable sources typically is effected by a so-called "R-2R" ladder network. Such a ladder network comprises a string of series-connected resistors of resistance R the junctions of which are connected through shunt resistors of resistance 2R to a common terminal of the ladder. The current sources are connected to respective junctions of the series resistors, and the composite output current is derived from a ladder output terminal at one end of the string of series resistors. (Further details of such ladder networks can be found in the above-mentioned Handbook, starting at page II-36.)

Conventionally, in a current-comparison type of analog-to-digital converter, the unknown analog input voltage is connected through an input resistor ($R_{in}$) to one input terminal of a comparator, to supply to that terminal a current proportional to the unknown analog voltage. The ladder output current also is supplied to that comparator terminal, in opposition to the analog input current, and the other comparator terminal is connected to ground (sometimes referred to as the "sense ground" in accordance with established grounding terminology). The comparator output is a logical 1 or 0 in accordance with whether the ladder output current is larger or smaller than the analog input current.

Although such ladder network arrangements have provided important advantages in the design of converters, they have introduced certain problems which have prevented the achievement of desired performance characteristics. For example, the current flowing through the ladder common terminal necessarily passes through a series lead resistance so as to introduce an extraneous voltage drop which varies with the digital word set up in the DAC. This variable voltage drop alters the effective potential applied to the resistors of the ladder, and thereby alters the division of current between the ladder output and the ladder common. This voltage drop cannot readily be compensated for because the current through the common terminal is not simply related to the magnitude of the digital word. Still another problem results from the relatively low internal impedance of a ladder network when using resistors of convenient size, since there is an effective gain loss when such a ladder network is coupled to an analog input resistor ($R_{in}$) properly sized for high-speed conversion operations. As one specific illustration, an R-2R network composed of 500 ohm series resistors and 1K ohm shunt resistors will have an effective series internal resistance of 1K ohms, so that when used with an input resistor of 2.5K ohms, to produce 4 ma of current with an input signal of 10 volts, the gain loss will be 3.5:1.

The problems discussed above are significantly minimized by novel features of the apparatus to be described hereinbelow.

SUMMARY OF THE INVENTION

In accordance with one important aspect of the invention, the ladder common terminal is connected to the output of an operational amplifier and, through a negative feedback circuit, to one of the amplifier input terminals so that the amplifier output constantly drives the ladder common terminal to the potential of the other amplifier input terminal. As will be described in detail, that other input terminal is in turn connected to a selected element of the converter so as to provide a circuit configuration which automatically drives the ladder common terminal to a potential minimizing the harmful effects of current flowing through the ladder common terminal. In one specific embodiment disclosed, the operational amplifier drives the ladder common terminal to the potential of the ladder output terminal. This result is achieved by connecting the ladder output terminal to the other amplifier input terminal. Since the amplifier output automatically is driven towards that value which reduces the input potential difference to zero, the potential of the ladder common terminal is maintained at the potential of the ladder output terminal.

It is desired to point out that significant advantages of the invention can be achieved with alternative configurations, e.g. wherein the operational amplifier drives the ladder common terminal to a control potential which does not necessarily continuously track the potential of the ladder output terminal. In some applications, it may be desirable to drive the ladder output terminal to a control potential corresponding to the sense ground potential, in which case the common junction between the ladder output terminal and the analog input resistor could be connected directly to the comparator, rather than to the input of the operational amplifier referred to above.

In the preferred embodiment to be described, the ladder output terminal and the ladder common terminal are continuously held at the same potential. Thus, the ladder behaves more as a true current source, without any dividing of the ladder voltage or current between an internal resistance and an external load resistance. Moreover, the ladder common terminal can be held quite precisely at the correct potential, because the potential sensing circuit (i.e. the negative feedback lead between the ladder common terminal and the amplifier input circuit) does not carry any significant current, due to the very high input impedance of an operational amplifier. Accordingly, there is negligible voltage drop in that feedback connection, and the amplifier output therefore continuously drives the common terminal to the correct potential, regardless of the amount of current passing through the connection between the ladder common terminal and the amplifier output. With the above-described arrangement, the ladder common terminal can serve to provide a signal for activating the comparator of the analog-to-digital converter, to determine at each step of the conversion sequence whether the DAC output is larger or smaller than the unknown analog input signal. The ladder common terminal can be especially effective in this role of providing the signal for the comparator, in part because the common terminal potential is (as described above) essentially unaffected by the variations in current flow from the network, and also because the ladder common terminal is driven by the relatively high-powered output of the operational amplifier, and thus can readily control the comparator input. In addition, in the embodiment to be described, there is minimal current flow in the sense ground lead. This is important because in some applications the user of the converter may have other devices connected in the system which devices can introduce relatively large resistances in the sense ground line leading back to the system common point. If the sens ground lead carries no current, there can be no voltage drops due to such line resistances.

Accordingly, it is a principal object of the present invention to provide a digital-to-analog converter having superior operating characteristics. Other more specific objects, aspects and advantages of the invention will in part be pointed out in, and in part apparent from, the following description considered together with the accompanying drawings.

BRIEF DESCRIPTION OF THE DRAWINGS

FIGS. 1A and 1B together present a schematic diagram showing a preferred embodiment of the invention; and FIG. 2 illustrates details of one type of operational amplifier which can be used in the disclosed converter.

DETAILED DESCRIPTION OF A PREFERRED EMBODIMENT

Figure 1A:
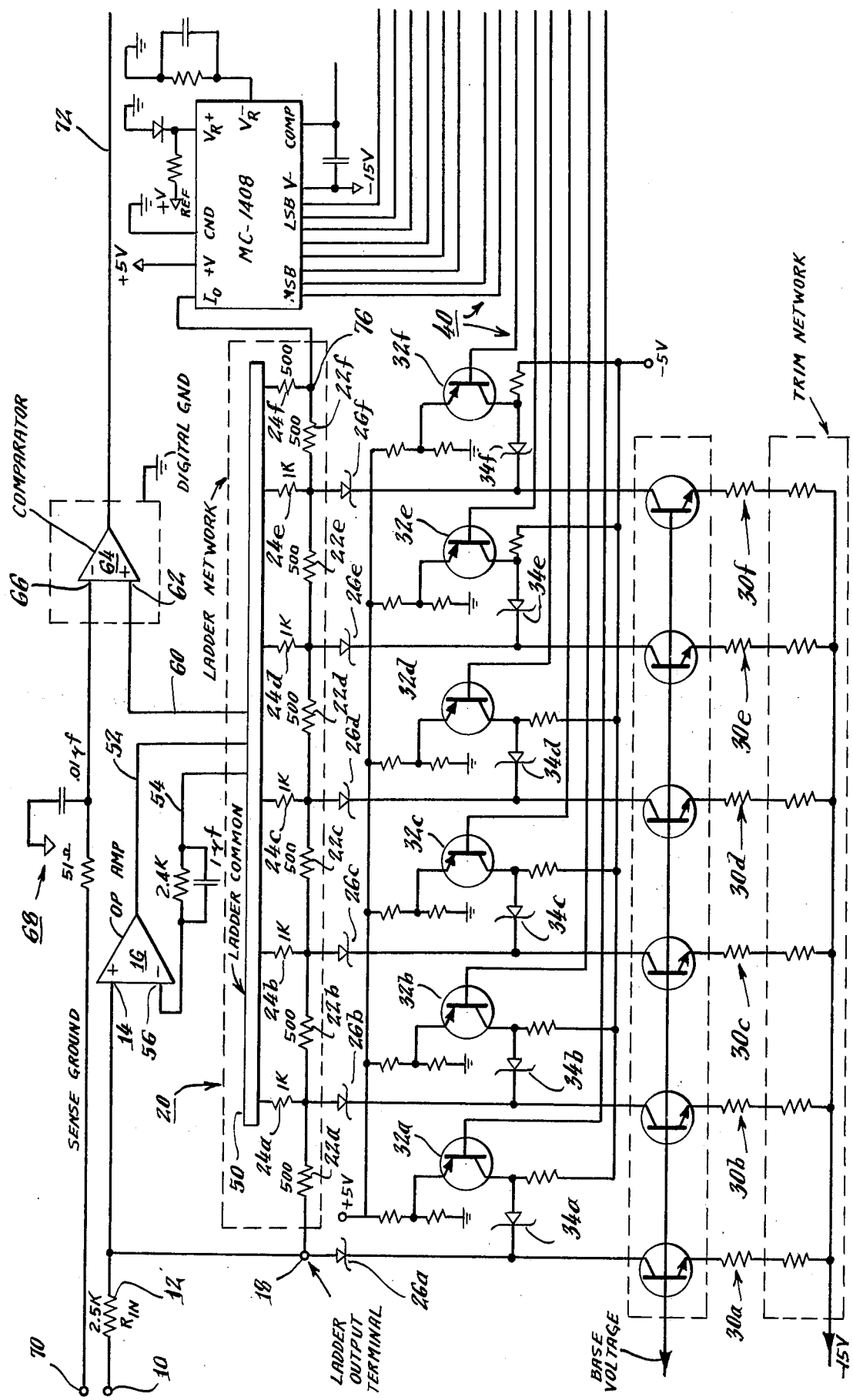

Referring now to FIG. 1A, the preferred converter includes an input terminal 10 to which an unknown analog voltage is to be applied. This terminal is coupled through an input resistor 12 ($R_{in}$) to one input terminal 14 of an operational amplifier 16. Also connected to this amplifier input terminal is the output terminal 18 of an R-2R ladder network generally indicated at 20, so that the analog input current and the ladder output current can be summed at terminal 14.

The ladder network 20 consists of a set of series resistors 22a, 22b, etc., (500 ohms) and a corresponding series of shunt resistors 24a, 24b, etc., (1K ohms). The ends of the series resistors are connected through line diodes 26a, 26b, etc., (1N 4149), to respective independently-switchable current sources generally indicated at 30a, 30b, etc. These current sources comprise a known transistor circuit wherein the emitters are connected through corresponding current-setting resistors to a negative voltage line. The current sources produce identical current (e.g. 2 ma), and the transistor base voltages preferably are regulated by a reference loop such as is described in U.S. Pat. No. 3,685,045, issued to J. J. Pastoriza on Aug. 15, 1972.

The current sources 30a, etc., are switched on or off by respective logic buffers 32a, 32b, etc., coupled to the current source collectors by corresponding diodes 34a, 34b, etc. (2N 4258). Current flowing through the coupling diode from the logic buffer raises the collector voltage sufficiently to cut off the corresponding line diode 26a, etc., thereby to switch off the corresponding current source 30a, etc., from the ladder network. The logic buffers are controlled by signals applied to their base by respective control lines generally indicated at 40. These control lines are supplied (as is conventional) with switch control signals from a bit sequencer and storage register arrangement of known configuration, e.g. as generally indicated at 42 in FIG. 1B.

Returning now to the series/shunt ladder network 20, it will be seen that the shunt resistors 24a, etc. are all connected to a common terminal 50. This terminal, as is indicated schematically, is preferably configured as a conductive element of quite large area, to provide a correspondingly low resistivity. The ends of each resistor are connected directly to this common terminal without significant lead length, thus essentially avoiding any series lead resistance between the common terminal and the shunt resistors.

The common terminal 50 is connected by a lead 52 to the output of the operational amplifier 16. The common terminal also is connected, by a separate negative feedback lead 54, to the other input terminal 56 of the amplifier. Thus, the amplifier drives the ladder common to a control potential equal to that of the first input terminal 14. As noted above, in the disclosed embodiment this amplifier terminal 14 is connected to the ladder output terminal 18, so that the ladder output and common terminals will be maintained at the same potential.

The potential of the common terminal 20, with the amplifier drive arrangement just described, will be controlled essentially independently of the variations in ground current passing through that terminal as the current sources 30a, etc., are switched on and off, in different combinations. The current to the common terminal is supplied by the amplifier through lead 52. It should be noted, however, that the potential-sensing feedback lead 54 carries essentially no current, due to the very high input impedance of the operational amplifier, and therefore the potential sensed at the amplifier input terminal 56 is effectively identical to the actual potential of the common terminal 20, without any error due to voltage drops from the lead resistance of lead 52. Thus, the common terminal is positively and actively held at the desired control potential, so as to minimize any errors due to changes in the splitting of the currents from sources 30a, etc., between the output terminal 18 and the common terminal 50. That is, the current split produced by the ladder network is made more truly dependent only on the relative magnitudes of the series/shunt resistors.

Also by controlling the common ladder terminal 50 so that its potential always is equal to that of the ladder output terminal 18, as in the preferred embodiment described above, the ladder network appears to the converter input circuit as a true current source, so that its behavior is nearly independent of the load coupled to it. This characteristic provides important benefits in improving the converter performance, as discussed hereinabove in the introductory descriptive material.

The common ladder terminal 50 is connected by a third lead 60 to one input terminal 62 of a conventional comparator 64, the other input terminal 66 of which is connected through a filter 68 to sense ground 70 (i.e. the user's analog signal ground connection). The output 72 of the comparator is connected to the bit sequencer circuitry 42 to effect control over that circuitry in the usual fashion, at each step of the successive-approximation sequence. That is, as each of the current sources 30a, etc., is turned on by the bit sequencer, a comparison is made between the unknown analog input current and the ladder output current (at terminal 18), and the results of such comparison is reflected in the potential of the amplifier input terminal 14, and thereby reflected in the potential of the common terminal 50 which is connected to the comparator. The output signal of the comparator will be either logical 1 or logical 0, depending upon the relative magnitudes of the compared currents, and this output signal will be fed to the bit sequencer to set that circuitry correspondingly, in accordance with known techniques.

In the converter described herein, the specially-arranged R-2R ladder network 20 is used only with the first six bits of the DAC, since these bits are the most important. To accommodate additional bits, for finer resolution, the end terminal 76 of the ladder is connected to the current terminal $I_0$ of a conventional DAC, generally indicated in block format at 78, and which may for example be of the type referred to commercially as MC-1408. A number of the control lines 40 from the bit sequencer 42 also are connected to terminals of this DAC, to provide for the required steps of the successive approximation cycle through the corresponding lower-level bits. The DAC also is furnished with the usual supply voltages and ground connections.

As previously stated, the bit sequencer and storage register arrangement of the converter can be of any suitable type known in the prior art. As an illustration, FIG. 1B shows the incorporation of two commercial registers 80, 82 manufactured by Advanced Micro Devices, Inc., and identified as AM 2502 and AM 2503. The output terminals of these registers are connected to the control lines 40, and also to the digital output terminals of the converter, generally indicated at 84. The registers 80, 82 are controlled by conventional logic circuitry 86 provided with the usual input/output terminals as shown in the drawing.

FIG. 2 has been included to illustrate the details of one operational amplifier 16 which has been found to be well suited for use with the present invention. Other amplifiers can of course be employed in achieving the objects of the invention.

Although one specific preferred embodiment of the invention has been described hereinabove in detail, it is to be understood that this is for the purpose of illustrating the principles of the invention and is not to be construed as necessarily limiting of the invention except as required by the prior art.

I claim:

1. In a digital-to-analog converter including a current-dividing resistor network comprising a plurality of interconnected resistors with an output terminal and a common terminal; a set of switchable current sources connected to respective junction points of said resistor network in such manner that the network serves to divide the currents of the switched-on sources between said output terminal and said common terminal to produce at said output terminal a network output signal signifying which current sources are on;
   the improvement in such converter which comprises:
   an operational amplifier having two input terminals;
   means connecting the output of said operational amplifier to said network common terminal; and
   negative feedback means connecting said network common terminal to an input terminal of said operational amplifier, said amplifier output supplying current to said common terminal to drive its potential to the potential of the other input terminal independently of which of said current sources is switched on.

2. Apparatus as in claim 1, wherein said network is an R-2R ladder having a set of series resistors and a set of shunt resistors each connected to a terminal of said series resistors;
   said current sources being connected to respective junctions of said series and shunt resistors;
   the remote ends of said shunt resistors being connected to said common terminal.

3. Apparatus as in claim 1, wherein said common terminal is a conductive element of relatively large area to which said shunt resistors are connected at regions adjacent the respective shunt resistor whereby to minimize the connecting lead length.

4. Apparatus as in claim 1, wherein the network output terminal is connected to the other input terminal of said operational amplifier;
   said operational amplifier serving to drive said common terminal to a potential equal to that of said network output terminal.

5. Apparatus as in claim 4, wherein said current sources comprise respective transistors the emitters of which are connected through corresponding resistors to a common voltage supply line.

6. In an analog-to-digital converter having an input circuit to receive an analog input signal and including a current-dividing resistor network comprising a plurality of interconnected resistors with an output terminal and a common terminal; a set of switchable current sources connected to respective junction points of said resistor network in such manner that the network serves to divide the currents of the switched-on sources between said output terminal and said common terminal to produce at said output terminal a network output signal signifying which current sources are on; and means to compare said network output signal with said analog input signal to control the switching of said current sources:
   the improvement in such converter which comprises:
   an operational amplifier having two input terminals;

means connecting the output of said operational amplifier to said network common terminal; and negative feedback means connecting said network common terminal to an input terminal of said operational amplifier, said amplifier output supplying current to said common terminal to drive its potential to the potential of the other input terminal independently of which of said current sources is switched on.

7. Apparatus as in claim 6, wherein said converter includes an input circuit having an input resistor to produce an input current corresponding to an applied input voltage; and means coupling said network output terminal to said input resistor to provide for summation of said input current and the network output current.

8. Apparatus as in claim 6, wherein said network is an R-2R ladder having a set of series resistors and a set of shunt resistors each connected to a terminal of said series resistors;

said current sources being connected to respective junctions of said series/shunt resistors;

the remote end of said shunt resistors being connected to said common terminal.

9. Apparatus as in claim 8, wherein the converter input circuit and said network output terminal are connected together to the other input terminal of said operational amplifier, to provide for summing of said analog input signal and said network output signal;

said operational amplifier serving to drive said common terminal to a potential equal to that of said network output terminal.

10. Apparatus as in claim 9, wherein said current sources comprise respective transistors the emitters of which are connected through corresponding resistors to a common voltage supply line.

11. Apparatus as in claim 8, wherein said common terminal is a conductive element of relatively large area to which said shunt resistors are connected at regions adjacent the respective shunt resistor whereby to minimize the connecting lead length.

12. Apparatus as in claim 6, wherein said means to compare said network output signal and said analog input signal includes a comparator having first and second input terminals to receive signals to be compared and having an output terminal adapted to produce a logical compare signal indicating the results of the comparison;

a sense ground circuit; and means to connect said first comparator input terminal to said network common terminal and said second comparator input terminal to said sense ground circuit whereby the relative magnitudes of said analog input signal and said network output signal are determined with respect to the potential of said sense ground circuit.

13. An analog-to-digital converter of the successive-approximation type comprising:

an input circuit including an input resistor to receive an analog input voltage and to produce a corresponding analog input current;

an R-2R current-dividing ladder network comprising a string of series-connected resistors and a set of shunt resistors each connected at one end to a respective terminal of said string of series resistors;

means connecting the other ends of said shunt resistors to a common terminal for said ladder network;

an output terminal for said ladder network at one end of said string of series-connected resistors;

a set of switchable current sources connected to respective junction points of said series and shunt resistors so that the network serves to divide the currents of the switched-on sources between said ladder output terminal and said ladder common terminal to produce at said output terminal a ladder output current determined by which of said current sources have been switched on;

an operational amplifier having first and second input terminals;

means connecting said input resistor and said ladder output terminal to said first input terminal; means connecting the output of said operational amplifier to said ladder common terminal;

negative feedback means connecting said ladder common terminal to said second amplifier input terminal, said amplifier output serving to control the potential of said ladder common terminal to equal that of said ladder output terminal;

a comparator having two input terminals;

a sense ground circuit connected to one of said comparator input terminals;

means to connect said ladder common terminal to the other of said comparator input terminals; and means responsive to the output of said comparator for controlling the switching of said current sources through a successive-approximation conversion cycle.

14. Apparatus as in claim 13, wherein the effective internal resistance of said ladder network is less than the resistance of said input resistor.

15. Apparatus as in claim 14, wherein said internal resistance is approximately 1K ohms or less, and said input resistor has a resistance which is more than twice said internal resistance.

16. Apparatus as in claim 13, wherein said common terminal comprises a large-area conductive element to which said shunt resistors are connected at respective points with effectively minimal lead length.

* * * * *